US005102832A

United States Patent [19]

Tuttle

[11] Patent Number: 5,102,832
[45] Date of Patent: Apr. 7, 1992

[54] METHODS FOR TEXTURIZING POLYSILICON

[75] Inventor: Mark E. Tuttle, Boise, Id.

[73] Assignee: Micron Technology, Inc., Boise, Id.

[21] Appl. No.: 653,839

[22] Filed: Feb. 11, 1991

[51] Int. Cl.$^5$ .......................................... H01L 21/205
[52] U.S. Cl. ...................................... 437/231; 437/233; 437/238; 437/243; 437/946; 437/977; 437/212; 427/212
[58] Field of Search ............... 437/231, 233, 238, 241, 437/243, 245, 946, 977; 427/212, 217; 148/DIG. 109

[56] References Cited

FOREIGN PATENT DOCUMENTS 59-123279  7/1984  Japan ............................ 437/977
63-239937 10/1988  Japan ............................ 437/233

OTHER PUBLICATIONS

"Rugged Surface Poly-Si Electrode and Low Temperature Deposited Si3N4 for 64 Mb and Beyond STC Dram Cell" by M. Yoshimaru et al., Oki Electric Industry Co., Ltd., VLSI R&D Laboratory 550-1.

Primary Examiner—Robert Kunemund
Assistant Examiner—Andrew Griffis
Attorney, Agent, or Firm—David J. Paul

[57] ABSTRACT

A process for texturization of polycrystalline silicon comprising the steps of preparing the wafer surface prior to poly deposition with a material which will cause the poly to preferentially nucleate during deposition and form poly nodules on the wafer surface. Polysilicon will continue to coat the previously created poly nodules throughout poly deposition, thereby resulting in a stable, texturized polysilicon structure.

14 Claims, 3 Drawing Sheets

METHODS FOR TEXTURIZING POLYSILICON

FIELD OF THE INVENTION

This invention relates to semiconductor technology, and more specifically, to processer for imparting a texturized surface to a polycrystalline silicon layer.

BACKGROUND OF THE INVENTION

A process for texturizing polycrystalline silicon (hereinafter also "polysilicon" or "poly") is discussed in an article entitled "Rugged Surface Poly-Si Electrode and Low Temperature Deposited Si3N4 for 64 Mb and Beyond STC DRAM Cell" authored by M. Yoshimaru et al., Oki Electric Industry Co., Ltd., VLSI R&D Laboratory 550-1, Higashiasakawa, Hachioji, Tokyo 193, Japan. In this article, using a poly deposition temperature of 570 degrees Celsius causes the poly layer surface to become rugged (or textured). The article claims (in the third paragraph of the first page) that applying this technique to form a storage node cell plate of a dynamic random access memory's (DRAM) storage stacked capacitor, results in an increase of the cell plate's surface area of up to 2.5 times that of a standard stacked capacitor cell (STC).

Two main drawbacks with this method are the facts that, 1) the temperature must be precisely controlled (within +/−3 degrees C of 570C.) during deposition to form the rugged poly surface; and 2) subjecting the rugged poly to temperatures above 570 degrees C. in subsequent process steps will cause the rugged surface to flatten out.

In the present invention, a stable and uniform texturized poly surface is developed that will retain its textured surface throughout implementation of conventional DRAM fabrication processes.

SUMMARY OF THE INVENTION

The present invention is a process for texturizing a polycrystalline silicon (polysilicon or poly) layer to be used as a capacitor's storage node cell plate in semiconductor devices, such as memory devices and in particular dynamic random access memories or DRAMs. The following discussion focuses on using the process developed in the present invention during a conventional stacked capacitor DRAM fabrication process to serve as an example. However, it is understandable that those skilled-in-the-art could apply the techniques described by the present invention to a variety of semiconductor devices where polysilicon is used and it is desired to have that polysilicon take on a texturized surface.

A silicon wafer is fabricated prior to depositing a poly layer to be used as a storage node cell plate of a capacitor in a DRAM array. In this example, a buried digit line contact opening has been prepared for a subsequent deposition of polysilicon that will make contact to the active area of an access device and will later be patterned and doped to serve as a stacked capacitor's storage node cell plate.

The polysilicon is texturized by preparing the wafer surface prior to poly deposition by coating the surface with extremely small particles (30–300 angstroms in diameter) such as silicon dioxide (SiO2) or silicon (Si). The wafer surface could also be prepared by subjecting the wafer surface to contaminants such as H2O or various hydrocarbons. The presence of these small particles or intentionally introduced contaminants will cause a subsequently deposited poly to preferentially nucleate thereby forming poly nodules on the wafer surface. As deposition continues, poly continues to coat the poly nodules thus resulting in a texturized polysilicon layer.

Polysilicon texturized in accordance with the process which constitutes the present invention may be used in a variety of applications and specifically to increase DRAM cell capacitance.

PREFERRED EMBODIMENT OF THE INVENTION

Figure 1:
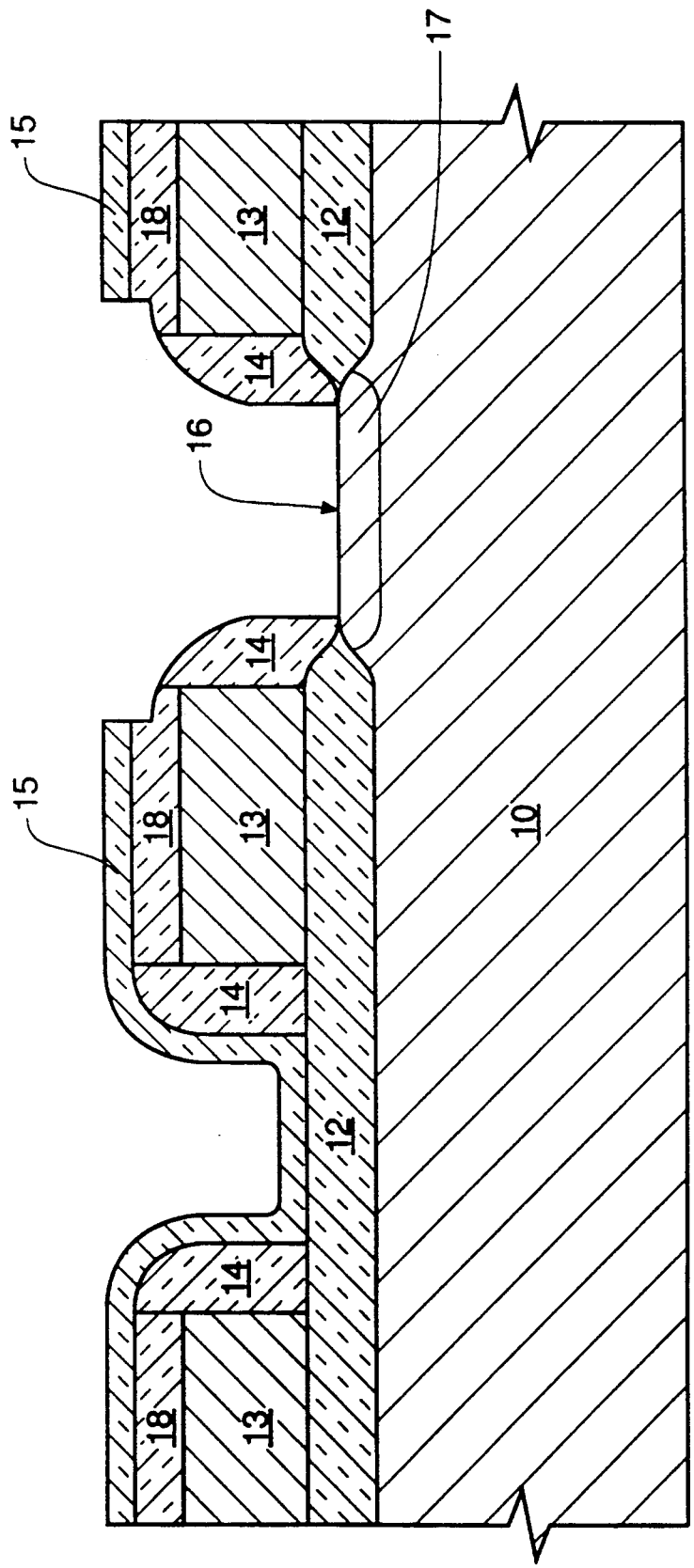
FIG. 1 is a cross-sectional view of a silicon wafer that has been developed up to the point prior to formation of a poly storage node cell plate for a DRAM array.
Figure 2:
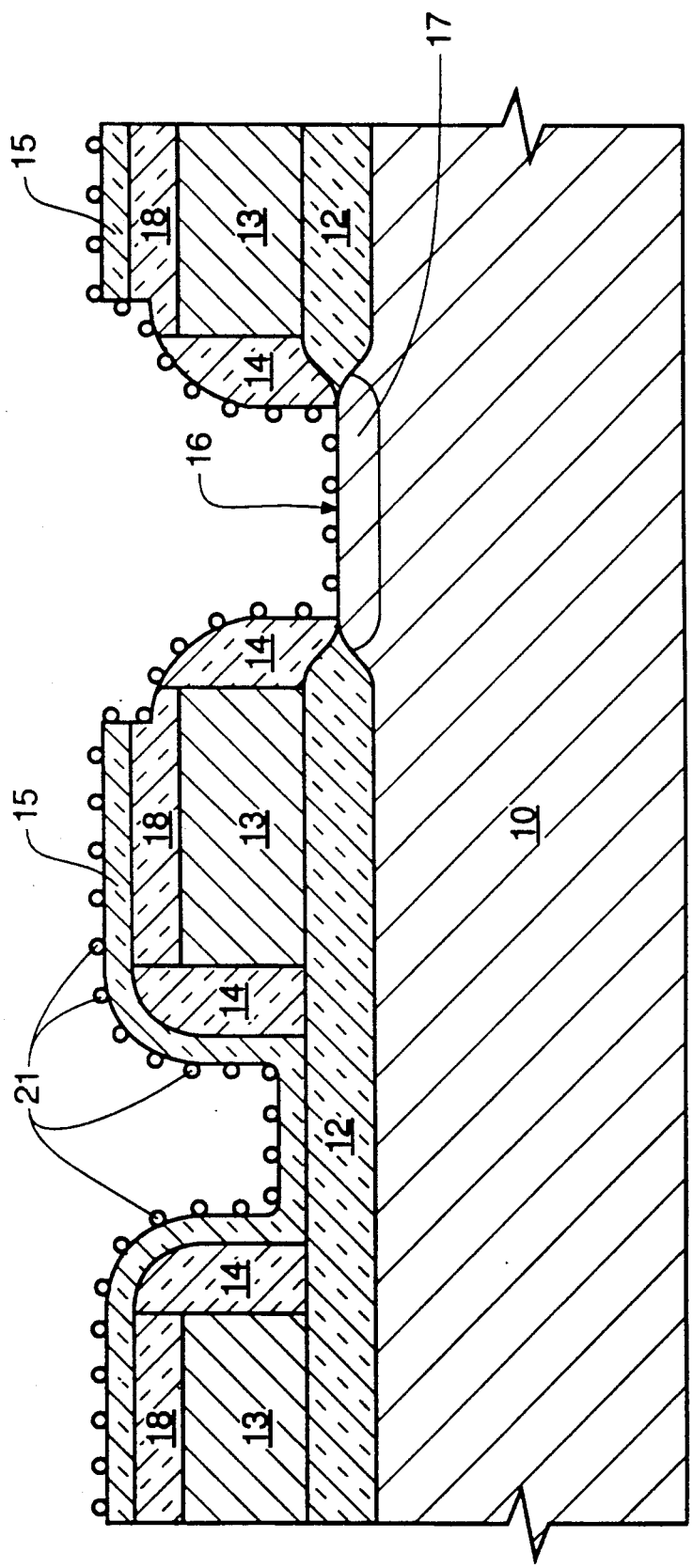
FIG. 2 is a cross-sectional view of the silicon wafer of FIG. 1 following pretreatment of the silicon wafer surface.
Figure 3:
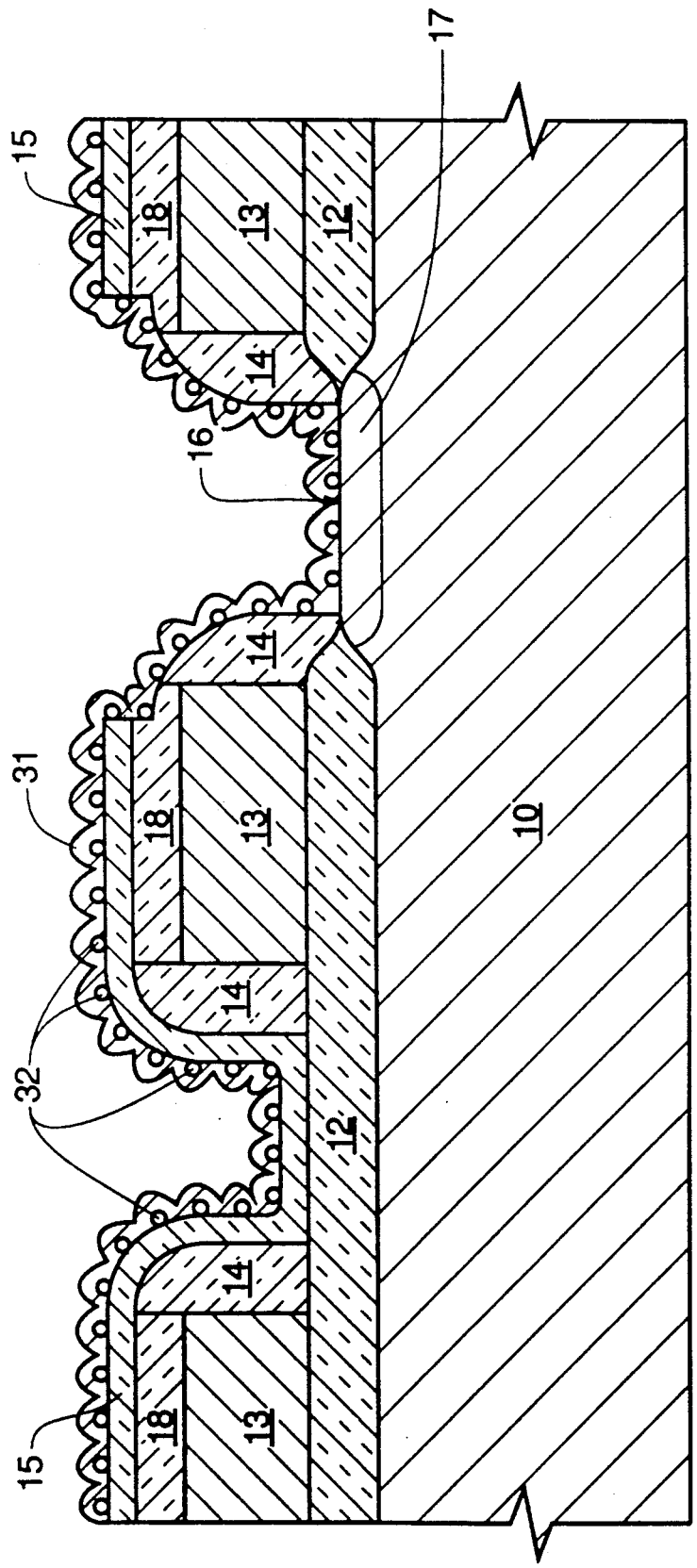
FIG. 3 is a cross-sectional view of the silicon wafer of FIG. 2 following a conformal deposition of polysilicon.

A preferred embodiment of the texturization process as performed on DRAM memory array, includes the steps described in FIGS. 1 through 3.

Referring now to FIG. 1, a silicon wafer 10 has been fabricated up to a point prior to formation of a poly storage node cell plate in a memory array. The conventional fabrication process to develop a standard stacked capacitor cell has developed field oxide 12 separating digit lines 13 from silicon substrate 10. Digit lines 13 are isolated by vertical dielectric spacers 14, dielectric layer 18 and a conformal dielectric layer 15. A buried contact location 16 has been opened to provide access to active area 17 for a storage node capacitor cell plate to be developed in the following steps.

Referring now to FIG. 2, particles 21 (preferably approximately 100 angstroms in diameter) uniformly coat exposed surfaces of dielectric 15, vertical spacers 14, dielectric layer 18, and active area 17. For example, these particles could be silicon (Si) or silicon dioxide (SiO2) that are evenly dispersed onto the exposed wafer surface with an atomizer. As a second alternative, the wafer surface is subjected to water or various hydrocarbons or any chemical to introduce contaminants that will remain on the surface. As a third alternative, SiO2 or Si particles are mixed in a liquid solution, such as an alcohol-based solvent, and spun onto the wafer surface by using conventional liquid spin-on techniques such as one used to spin on photoresist. After the particle laced solution is spun on, the wafer is dried causing the solution to evaporate and thereby leaving only the particles adhered to the wafer surface. As a fourth alternative, a wafer is dipped into a liquid tank containing a colloidal suspension of particles. The wafer is removed from the tank and dried leaving the particles adhered to the wafer surface. The presence of such particles mentioned will affect the initial stages of poly deposition by coating the particles to form poly nodules which will be discussed next.

Referring now to FIG. 3, a layer of polysilicon 31 is deposited by chemical vapor deposition. In the early stages of polysilicon 31 deposition the presence of particles 21 or other intentionally placed chemical contaminants cause poly 31 to nucleate, thereby forming poly nodules 32. As deposition continues, poly nodules 32 will be repetitively covered to form a texturized surface of poly 31.

From this point on, the stacked capacitor is completed using conventional stacked capacitor fabrication techniques for DRAMs.

Although the preferred embodiment focuses on using the process developed in the present invention during a conventional stacked capacitor DRAM fabrication process, it will be apparent to one skilled-in-the-art that the techniques described by the present invention may be applied to various semiconductor fabrication processes where polysilicon is used and it is desired to have that polysilicon take on a texturized surface. It will also be apparent to one skilled-in-the-art that changes and modifications may be made thereto without departing from the spirit and scope of the invention as claimed.

I claim:

1. A process for texturizing polycrystalline silicon deposited on a silicon wafer surface, comprising the following steps of:
   a) pretreating the wafer surface with particles of 30-300 angstroms in diameter about said wafer surface, said pretreating comprises evenly dispersing said particles, mixed into a liquid solution, by liquid spin-on and drying the wafer to evaporate the liquid thereby leaving said particles adhered to said wafer surface;
   b) depositing an initial layer of said polycrystalline silicon on said wafer surface whereby presence of said particles cause said initial polycrystalline silicon layer to coat said particles and thereby form poly nodules;
   c) depositing subsequent conformal polycrystalline silicon layers superjacent to said wafer surface thereby coating said poly nodules and causing said polysilicon structure to become texturized.

2. The process of claim 1, wherein said particles are Si.

3. The process of claim 1, wherein said particles are SiO2.

4. The process of claim 1, wherein said liquid solution is an alcohol-based solvent.

5. The process of claim 1, wherein said liquid solution is a colloidal suspension of particles.

6. The process of claim 1, wherein said liquid solution is a slurry.

7. A process for texturizing polycrystalline solution deposited on a silicon wafer surface, comprising the following steps of:
   a) pretreating the wafer surface with particles of 30-300 angstroms in diameter dispersed about said wafer surface, said pretreating comprises dipping the wafer into a liquid tank containing a colloidal suspension of particles and drying said wafer thereby leaving said particles adhered to said wafer surface;
   b) depositing an initial layer of said polycrystalline silicon on said wafer surface whereby presence of said particles cause said initial polycrystalline silicon layer to coat said particles and thereby form poly nodules;
   c) depositing subsequent conformal polycrystalline silicon layers superjacent to said wafer surface thereby coating said poly nodules and causing said polysilicon structure to become texturized.

8. A process for texturizing polycrystalline silicon deposited on a silicon wafer surface, comprising the following steps of:
   a) pretreating the wafer surface with particles of 30-300 angstroms in diameter dispersed about said wafer surface, said pretreating comprises subjecting said wafer surface to water;
   b) depositing an initial layer of said polycrystalline silicon on said wafer surface whereby presence of said particles cause said initial polycrystalline silicon layer to coat said particles and thereby form poly nodules;
   c) depositing subsequent conformal polycrystalline silicon layers superjacent to said wafer surface thereby coating said poly nodules and causing said polysilicon structure to become texturized.

9. A process for texturizing polycrystalline silicon deposited on a silicon wafer surface, comprising the following steps of:
   a) pretreating the wafer surface with particles of 30-300 angstroms in diameter dispersed about said wafer surface, said pretreating comprises subjecting said wafer surface to a hydrocarbon;
   b) depositing an initial layer of said polycrystalline silicon on said wafer surface whereby presence of said particles cause said initial polycrystalline silicon layer to coat said particles and thereby form poly nodules;
   c) depositing subsequent conformal polycrystalline silicon layers superjacent to said wafer surface thereby coating said poly nodules and causing said polysilicon structure to become texturized.

10. A process for texturizing a polysilicon storage node capacitor cell plate in a DRAM fabricated on a silicon wafer, comprising the following steps of:
    a) pretreating the wafer surface with particles of 30-300 angstroms in diameter, dispersed evenly about said wafer surface, said pretreating comprises evenly dispersing Si particles mixed into a liquid solution by liquid spin-on and drying said wafer to evaporate the liquid thereby leaving said Si particles adhered to said wafer surface;
    b) depositing an initial layer of said polycrystalline silicon on said wafer surface whereby presence of said particles cause said initial polycrystalline silicon layer to nucleate and thereby form poly nodules; and
    c) depositing subsequent conformal polycrystalline silicon layers superjacent to said wafer surface thereby coating said poly nodules and causing said polysilicon storage node capacitor cell plate to become texturized.

11. A process for texturizing a polysilicon storage node capacitor cell plate in a DRAM fabricated on a silicon wafer, comprising the following steps of:
    a) pretreating the wafer surface with particles of 30-300 angstroms in diameter, dispersed evenly about said wafer surface, said pretreating comprises evenly dispersing SiO2 particles mixed into a liquid solution by liquid spin-on and drying said wafer to evaporate the liquid thereby leaving said SiO2 particles adhered to said wafer surface;
    b) depositing an initial layer of said polycrystalline silicon on said wafer surface whereby presence of said particles cause said initial polycrystalline silicon layer to nucleate and thereby form poly nodules; and
    c) depositing subsequent conformal polycrystalline silicon layers superjacent to said wafer surface thereby coating said poly nodules and causing said polysilicon storage node capacitor cell plate to become texturized.

12. A process for texturizing a polysilicon storage node capacitor cell plate in a DRAM fabricated on a silicon wafer, comprising the following steps of:
 a) pretreating the wafer surface with particles of 30-300 angstroms in diameter, dispersed evenly about said wafer surface, said pretreating comprises dipping said wafer into a liquid tank containing a colloidal suspension of particles and drying said wafer thereby leaving said particles adhered to said wafer surface;
 b) depositing the initial layer of said polycrystalline silicon on said wafer surface whereby presence of said particles cause said initial polycrystalline silicon layer to nucleate and thereby form poly nodules; and
 c) depositing subsequent conformal polycrystalline silicon layers superjacent to said wafer surface thereby coating said poly nodules and causing said polysilicon storage node capacitor cell plate to become texturized.

13. A process for texturizing a polysilicon storage node capacitor cell plate in a DRAM fabricated on a silicon wafer, comprising the following steps of:
 a) pretreating the wafer surface with particles of 30-300 angstroms in diameter, dispersed evenly about said wafer surface, said pretreating comprises subjecting said wafer surface to water;
 b) depositing an initial layer of said polycrystalline silicon on said wafer surface whereby presence of said particles cause said initial polycrystalline silicon layer to nucleate and thereby form poly nodules; and
 c) depositing subsequent conformal polycrystalline silicon layers superjacent to said wafer surface thereby coating said poly nodules and causing said polysilicon storage node capacitor cell plate to become texturized.

14. A process for texturizing a polysilicon storage node capacitor cell plate in a DRAM fabricated on a silicon wafer, comprising the following steps of:
 a) pretreating the wafer surface with particles of 30-300 angstroms in diameter, dispersed evenly about said wafer surface, said pretreating comprises subjecting said wafer surface to a hydrocarbon;
 b) depositing an initial layer of said polycrystalline silicon on said wafer surface whereby presence of said particles cause said initial polycrystalline silicon layer to nucleate and thereby form poly nodules; and
 c) depositing subsequent conformal polycrystalline silicon layers superjacent to said wafer surface thereby coating said poly nodules and causing said polysilicon storage node capacitor cell plate to become texturized.

* * * * *